US012429505B2

(12) United States Patent
Tezuka

(10) Patent No.: US 12,429,505 B2
(45) Date of Patent: Sep. 30, 2025

(54) VOLTAGE DETECTION CIRCUIT

(71) Applicant: Hitachi Astemo, Ltd., Hitachinaka (JP)

(72) Inventor: Toshinari Tezuka, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 187 days.

(21) Appl. No.: 18/267,602

(22) PCT Filed: Sep. 29, 2021

(86) PCT No.: PCT/JP2021/036020
§ 371 (c)(1),
(2) Date: Jun. 15, 2023

(87) PCT Pub. No.: WO2022/137705
PCT Pub. Date: Jun. 30, 2022

(65) Prior Publication Data
US 2024/0044949 A1 Feb. 8, 2024

(30) Foreign Application Priority Data

Dec. 22, 2020 (JP) ................................. 2020-212033

(51) Int. Cl.
| | | |
|---|---|---|
| G01R 19/165 | (2006.01) | |
| G01R 31/388 | (2019.01) | |
| G01R 35/00 | (2006.01) | |

(52) U.S. Cl.
CPC ..... G01R 19/16542 (2013.01); G01R 31/388 (2019.01); G01R 35/00 (2013.01)

(58) Field of Classification Search
None
See application file for complete search history.

(56) References Cited

U.S. PATENT DOCUMENTS

| | | |
|---|---|---|
| 5,272,449 A | 12/1993 | Izawa |
| 12,082,118 B2 * | 9/2024 | Suzuki ................. G01R 31/371 |

(Continued)

FOREIGN PATENT DOCUMENTS

| | | |
|---|---|---|
| JP | 57-203134 A | 12/1982 |
| JP | 5-172853 A | 7/1993 |

(Continued)

OTHER PUBLICATIONS

International Search Report and Written Opinion, PCT/JP2021/036020, Dec. 21, 2021, 12 pgs.

*Primary Examiner* — Jermele M Hollington
(74) *Attorney, Agent, or Firm* — Volpe Koenig

(57) ABSTRACT

A voltage detection circuit includes a first buffer circuit and second buffer circuit that output a voltage corresponding to an input voltage, a voltage detection unit that detects an output voltage from the first buffer circuit and an output voltage from the second buffer circuit, a reference voltage output circuit capable of selectively outputting one of a plurality of reference voltages different in voltage value from each other, and a switch circuit connected to the first buffer circuit and second buffer circuit. The switch circuit switches an input voltage to the first buffer circuit, from a first input voltage corresponding to a voltage of a first input terminal connected to a measurement target to the reference voltage outputted from the reference voltage output circuit, and switches an input voltage to the second buffer circuit, from a second input voltage to the reference voltage outputted from the reference voltage output circuit.

11 Claims, 9 Drawing Sheets

(56) References Cited

U.S. PATENT DOCUMENTS

| | | |
|---|---|---|
| 2011/0260770 A1 | 10/2011 | Sekiguchi |
| 2015/0145522 A1 | 5/2015 | Oster et al. |
| 2017/0089969 A1 | 3/2017 | Igarashi et al. |
| 2019/0004116 A1 | 1/2019 | Sugimura |
| 2021/0025941 A1 | 1/2021 | Shimazaki et al. |
| 2021/0389380 A1 | 12/2021 | Mizoguchi |

FOREIGN PATENT DOCUMENTS

| | | |
|---|---|---|
| JP | 2011-232161 A | 11/2011 |
| JP | 2012-068074 A | 4/2012 |
| JP | 2015-522995 A | 8/2015 |
| JP | 6415566 B2 | 10/2018 |
| JP | 2019-012741 A | 1/2019 |
| JP | 2019-184577 A | 10/2019 |
| JP | 2020-139881 A | 9/2020 |

\* cited by examiner

FIG. 3

| Control State | | | At Normal Control | At Diagnosis of Amplifier in Abnormal State | | | | | | | | | | |
|---|---|---|---|---|---|---|---|---|---|---|---|---|---|---|
| | | | | Vref1 Check | | | | | Vref2 Check | | | | | |
| Failure Mode | | | Normal | In Normal Mode | Vref In Abnormal State | AMP1 In Abnormal State | AMP2 In Abnormal State | AMP3 In Abnormal State | In Normal Mode | Vref In Abnormal State | AMP1 In Abnormal State | AMP2 In Abnormal State | AMP3 In Abnormal State |
| SW Switching State at Diagnosis | Normal/Diagnosis Switching Signal | Normal Side | • | | | | | | | | | | |
| | | Diagnosis Side | | | | • | | | | | • | | |
| | Offset Switching Signal | Vref1 Side | • | | | • | | | | | | | |
| | | Vref2 Side | | | | | | | | | • | | |
| Voltage State of Each Unit (Part to be Monitored) | $V_{ref}$ | | Vref1 | Vref1 | ≠Vref1 | Vref1 | Vref1 | Vref1 | Vref2 | ≠Vref2 | Vref2 | Vref2 | Vref2 |
| | $V_{offset}$ | | Vref1 | Vref1 | ≠Vref1 | ≠Vref1 | Vref1 | Vref1 | Vref2 | ≠Vref2 | ≠Vref2 | Vref2 | Vref2 |
| | $V_{HVPC}$ | | =R5/(R4+R5)Vp +Vref1 | Vref1 | ≠Vref1 | ≠Vref1 | ≠Vref1 | Vref1 | Vref2 | ≠Vref2 | ≠Vref2 | ≠Vref2 | Vref2 |
| | $V_{HVNC}$ | | =R7/(R6+R7)Vn +Vref1 | Vref1 | ≠Vref1 | ≠Vref1 | ≠Vref1 | ≠Vref1 | Vref2 | ≠Vref2 | Vref2 | Vref2 | ≠Vref2 |

FIG. 4

| | CONTROL STATE | NORMAL MODE | | | | AT DIAGNOSIS OF SW BEING FIXED (Vref1 CHECK → Vref2 CHECK) | | | | | |
|---|---|---|---|---|---|---|---|---|---|---|---|
| | | | | | | SW1 | | SW2-1 | | SW2-2 | |
| | FAILURE MODE | NORMAL/DIAGNOSIS SWITCHING SIGNAL | | OFFSET SWITCHING SIGNAL | | FIXED TO Vref1 SIDE | FIXED TO Vref2 SIDE | FIXED TO DIAGNOSIS SIDE | FIXED TO NORMAL SIDE | FIXED TO DIAGNOSIS SIDE | FIXED TO NORMAL SIDE |
| | | NORMAL SIDE | DIAGNOSIS SIDE | Vref1 SIDE | Vref2 SIDE | | | | | | |
| SW SWITCHING STATE AT DIAGNOSIS | | ● | | ● | | ● | | ● | | ● | |
| | | | ● | | ● | | ● | | ● | | ● |
| VOLTAGE STATE OF EACH UNIT (PART TO BE MONITORED) | $V_{ref}$ | Vref1 | Vref2 | Vref1 | Vref2 | Vref1 | Vref2 | Vref1 | Vref2 | Vref1 | Vref2 |
| | $V_{offset}$ | Vref1 | Vref2 | Vref2 | Vref1 | Vref1 | Vref2 | Vref1 | Vref2 | Vref1 | Vref2 |
| | $V_{HVPC}$ | ≠Vref1 | ≠Vref2 | Vref2 | Vref1 | Vref1 | Vref2 | ≠Vref1 | ≠Vref2 | Vref1 | Vref2 |
| | $V_{HVNC}$ | ≠Vref1 | ≠Vref2 | Vref2 | Vref1 | Vref1 | Vref2 | Vref1 | Vref2 | ≠Vref1 | ≠Vref2 |

VOLTAGE DETECTION CIRCUIT

TECHNICAL FIELD

The present invention relates to a voltage detection circuit.

BACKGROUND ART

Conventionally, such a vehicle as an electric car or a hybrid car is equipped with an electric system in which DC power supplied from a high-voltage battery is converted by an inverter into AC power, which is outputted to a driving AC motor to rotate the motor, thus causing the vehicle to run. For such an electric system, a voltage detection circuit that detects a voltage of the high-voltage battery is widely used.

Information of the voltage of the high-voltage battery detected by the voltage detection circuit is used to control charging of the high-voltage battery and to control the inverter. To guarantee that these controls are solid one, the voltage detection circuit is required to have a failure detection function by which, at the occurrence of a failure, the voltage detection circuit can detect the failure by itself.

As a technique related to the present invention, a technique described in Patent Literature 1 is known. Patent Literature 1 discloses a technique applied to a voltage detection device in which voltage-dividing resistors are connected respectively to a positive electrode side and a negative electrode side of a DC power supply and a voltage of the DC power supply is detected through these voltage-dividing resistors. According to the technique, voltage fluctuations that result when pulses different in polarity from each other are applied to each voltage-dividing resistor to change its voltage-divided resistor value are observed to detect a failure of the voltage dividing resistor.

CITATION LIST

Patent Literature

PTL 1: JP 6415566 B2

SUMMARY OF INVENTION

Technical Problem

According to the technique described in Patent Literature 1, a failure of the voltage-dividing resistor can be detected but, when an abnormality occurs at a buffer circuit connected between the voltage-dividing resistor and a microcomputer that makes voltage measurement, such an abnormality cannot be detected. The present invention has been conceived to solve such a problem of the conventional technique, and an object of the present invention is to provide a voltage detection circuit that can implement more various abnormality diagnoses than those in conventional cases.

Solution to Problem

A voltage detection circuit according to the present invention includes: a first buffer circuit and a second buffer circuit that each output a voltage corresponding to an input voltage; a voltage detection unit that detects an output voltage from the first buffer circuit and an output voltage from the second buffer circuit; a reference voltage output circuit capable of selectively outputting one of a plurality of reference voltages different in voltage value from each other; and a switch circuit connected to the first buffer circuit and to the second buffer circuit. The switch circuit switches an input voltage to the first buffer circuit, from a first input voltage corresponding to a voltage of a first input terminal connected to a measurement target to the reference voltage outputted from the reference voltage output circuit, and switches an input voltage to the second buffer circuit, from a second input voltage corresponding to a voltage of a second input terminal connected to the measurement target to the reference voltage outputted from the reference voltage output circuit.

Advantageous Effects of Invention

According to the present invention, a voltage detection circuit that can implement more various abnormality diagnoses than those in conventional cases can be provided.

BRIEF DESCRIPTION OF DRAWINGS

FIG. 3 is an expectation value table for diagnosis of amplifier abnormality.

FIG. 4 is an expectation value table for diagnosis of a switch being fixed to a specific side.

DESCRIPTION OF EMBODIMENTS

Embodiments of the present invention will hereinafter be described with reference to the drawings. It should be noted that the drawings are simplified one. The technical scope of the present invention, therefore, should not be narrowly interpreted on the basis of simplified description of the drawings. The same elements are denoted by the same reference signs, and redundant description will be omitted.

First Embodiment

Embodiments of the present invention will hereinafter be described with reference to FIGS. 1 to 6.

Figure 1:
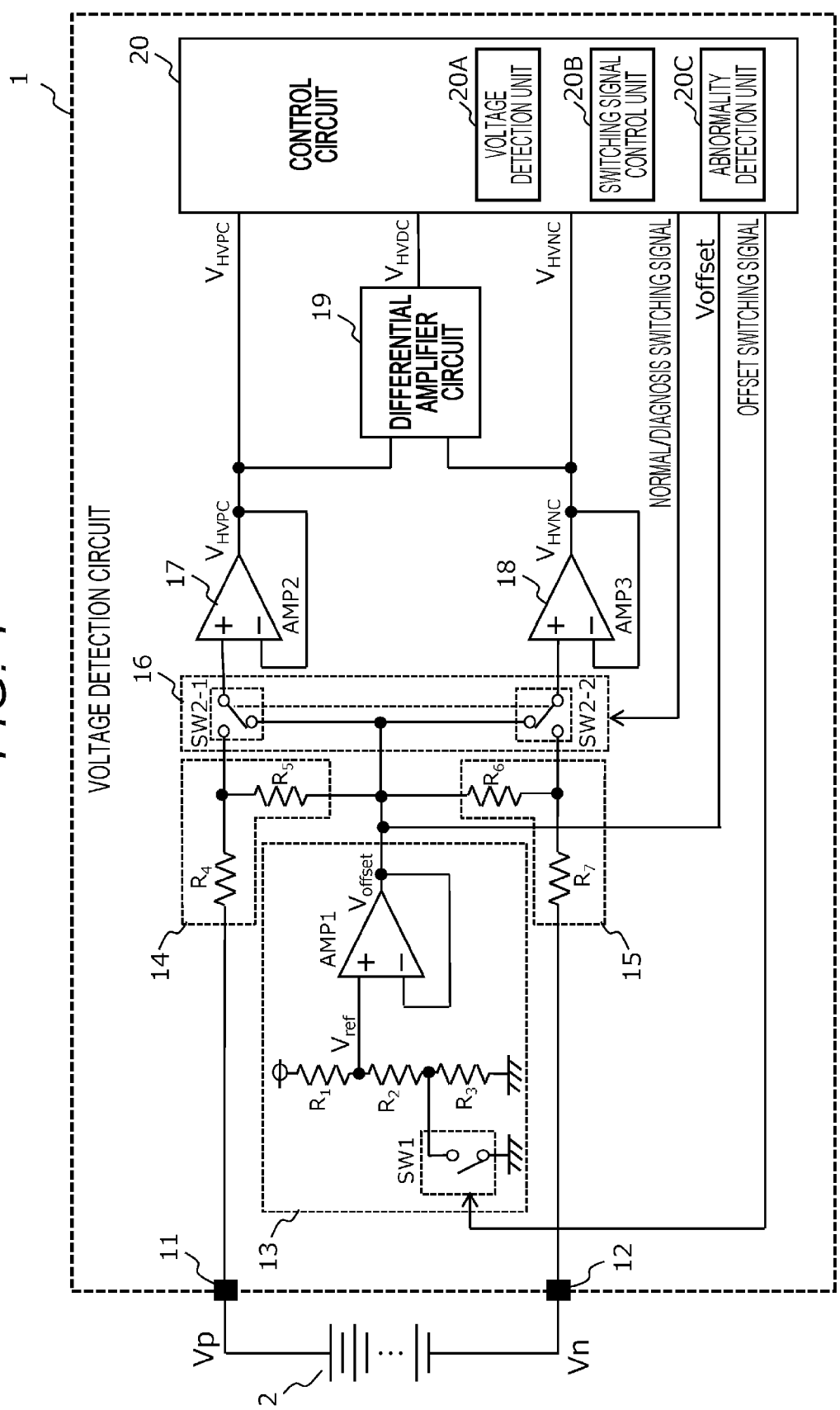
FIG. 1 is a configuration diagram of a voltage detection circuit according to a first embodiment of the present invention.

FIG. 1 is a configuration diagram of a voltage detection circuit according to a first embodiment of the present invention. A voltage detection circuit 1 according to the present embodiment is connected to a high-voltage battery 2, and detects a voltage of the high-voltage battery 2 that is inputted to the voltage detection circuit 1 via a positive electrode input terminal 11 and a negative electrode input terminal 12. As shown in FIG. 1, the voltage detection circuit 1 includes the positive electrode input terminal 11, the negative electrode input terminal 12, a reference voltage output circuit 13, a voltage-dividing circuit 14, a voltage-dividing circuit 15, a switch circuit 16, a buffer circuit 17, a buffer circuit 18, a differential amplifier circuit 19, and a control circuit 20.

The positive electrode input terminal 11 is connected to the positive electrode of the high-voltage battery 2, and receives input of a positive electrode voltage Vp from the high-voltage battery 2. The negative electrode input terminal 12 is connected to the negative electrode of the high-voltage battery 2, and receives input of a negative electrode voltage Vn from the high-voltage battery 2.

The reference voltage output circuit 13 includes a switch element SW1, resistors R1, R2, and R3, and an operational amplifier AMP1. The resistors R1, R2, and R3 are connected in series to make up a voltage-dividing circuit, which has one end connected to a source voltage node and the other end grounded.

The operational amplifier AMP1 outputs a voltage equal to an input voltage, and functions as a voltage follower (buffer circuit) that reduces the impedance of the output side. A voltage tracker IC or the like may be used in place of the operational amplifier. An input terminal of the operational amplifier AMP1 is connected between the resistor R1 and the resistor R2. To the input terminal, a reference voltage Vref is inputted as an input voltage to the operational amplifier AMP1, the voltage Vref being generated by dividing a source voltage by the voltage-dividing circuit. The operational amplifier AMP1 outputs an offset voltage Voffset that is identical with the reference voltage Vref. As a result, the prescribed reference voltage Vref (offset voltage Voffset) is outputted to each of the voltage-dividing circuits 14 and 15 connected to the output side of the reference voltage output circuit 13.

The switch element SW1 has one end connected between the resistor R2 and the resistor R3 and the other end grounded. According to an offset switching signal outputted from the control circuit 20, the switch element SW1 switches to an on-state or an off-state. This changes a connection state of the resistor R3 in the voltage-dividing circuit, thus changing a voltage-dividing ratio of the voltage-dividing circuit, and in accordance with the changing voltage-dividing ratio, the value of the reference voltage Vref changes. In other words, the reference voltage output circuit 13 is configured to be able to selectively output one of two types of reference voltages different in voltage value from each other through on/off switching by the switch element SW1.

A configuration of the reference voltage output circuit 13 shown in FIG. 1 is an example, and a different configuration of the reference voltage output circuit 13 may be adopted, providing that such a configuration allows selective output of one of two types of reference voltages different in voltage value from each other. Hereinafter, examples of different configurations of the reference voltage output circuit 13 will be described with reference to FIG. 2.

FIG. 2 depicts various configuration examples of the reference voltage output circuit 13. FIG. 2A shows the reference voltage output circuit 13 identical in configuration with the reference voltage output circuit 13 shown in FIG. 1. In an example of the reference voltage output circuit 13 shown in FIG. 2B, the switch element SW1 has the one end connected between the resistor R1 and the resistor R2 and the other end connected between the resistor R2 and the resistor R3. In an example shown in FIG. 2C, the reference voltage output circuit 13 includes two types of power supply circuits that output different source voltages, respectively, the power supply circuits being provided in place of the voltage-dividing circuit in which the resistors R1, R2, and R3 are connected in series, and the switch element SW1 is disposed between these power supply circuits and the input terminal of the operational amplifier AMP1. An example of FIG. 2D shows the reference voltage output circuit 13 given by removing the operational amplifier AMP1 from the circuit configuration shown in FIG. 2C.

In each of the configurations of FIGS. 2A, 2B, 2C, and 2D, the reference voltage output circuit 13 causes the switch element SW1 to switch according to the offset switching signal outputted from the control circuit 20, thereby selectively outputting one of the two types of reference voltages Vref, as the offset voltage Voffset. Hereinafter, the two types of reference voltages Vref outputted from the reference voltage output circuit 13 will be described as Vref1 and Vref2, respectively.

Each of the above examples is described as the example of the reference voltage output circuit 13 that according to the switching operation of switch element SW1, selectively outputs one of the reference voltages Vref1 and Vref2 as the offset voltage Voffset. However, the reference voltage output circuit 13 may be configured to be able to selectively output one of three or more types of reference voltages Vref. Furthermore, the reference voltage output circuit 13 may adopt any given circuit configuration different from the circuit configurations shown in the examples of FIG. 2, providing that the adopted circuit configuration allows selective output of a plurality of types of reference voltages.

FIG. 1 is referred to again. The voltage-dividing circuit 14 is composed of a resistor R4 and a resistor R5, and is connected between the positive electrode input terminal 11 and the reference voltage output circuit 13. To a node between the resistor R4 and the resistor R5, the buffer circuit 17 is connected via the switch circuit 16. The positive electrode voltage Vp inputted to the positive electrode input terminal 11 is divided by the voltage-dividing circuit 14 at a given voltage-dividing ratio, and is outputted to the buffer circuit 17 via the switch circuit 16.

The voltage-dividing circuit 15 is composed of a resistor R6 and a resistor R7, and is connected between the negative electrode input terminal 12 and the reference voltage output circuit 13. To a node between the resistor R6 and the resistor R7, the buffer circuit 18 is connected via the switch circuit 16. The negative electrode voltage Vn inputted to the negative electrode input terminal 12 is divided by the voltage-dividing circuit 15 at a given voltage-dividing ratio, and is outputted to the buffer circuit 18 via the switch circuit 16.

The offset voltage Voffset outputted from the reference voltage output circuit 13 is applied to the side of voltage-dividing circuit 14 that is opposite to the side closer to the positive electrode input terminal 11 and to the side of voltage-dividing circuit 15 that is opposite to the side closer to the negative electrode input terminal 12. As a result, in the voltage detection circuit 1, voltages generated by the voltage-dividing circuits 14 and 15 can be offset by the offset voltage Voffset.

The switch circuit 16 is connected between the reference voltage output circuit 13 and voltage-dividing circuit 14 and the buffer circuit 17, and between the reference voltage output circuit 13 and voltage-dividing circuit 15 and the buffer circuit 18. The switch circuit 16 includes a switch element SW2-1 and a switch element SW2-2.

The switch element SW2-1 is connected to the voltage-dividing circuit 14 and to the buffer circuit 17. According to a normal/diagnosis switching signal outputted from the control circuit 20, the switch element SW2-1 switches connection of an input terminal of the buffer circuit 17 to connection to the positive electrode input terminal 11 via the voltage-dividing circuit 14 or to connection to the reference voltage output circuit 13. By this switching operation of the switch element SW2-1, either a voltage given by dividing the positive electrode voltage Vp of the positive electrode input terminal 11 by the voltage-dividing circuit 14 or the offset voltage Voffset (reference voltage Vref1 or Vref2) outputted from the reference voltage output circuit 13 is selected as an input voltage to the buffer circuit 17.

The switch element SW2-2 is connected to the voltage-dividing circuit 15 and to the buffer circuit 18. According to the normal/diagnosis switching signal outputted from the control circuit 20, the switch element SW2-2 switches connection of an input terminal of the buffer circuit 18 to connection to the negative electrode input terminal 12 via the voltage-dividing circuit 15 or to connection to the reference voltage output circuit 13. By this switching operation of the switch element SW2-2, either a voltage given by dividing the negative electrode voltage Vn of the negative electrode input terminal 12 by the voltage-dividing circuit 15 or the offset voltage Voffset (reference voltage Vref1 or Vref2) outputted from the reference voltage output circuit 13 is selected as an input voltage to the buffer circuit 18.

The buffer circuit 17 outputs a voltage equal to an input voltage, and has a function of reducing the impedance of the output side. The buffer circuit 17 is composed of a voltage follower using an operational amplifier AMP2. In place of the voltage follower, a voltage tracker IC or the like may be used to configure the buffer circuit 17. An output voltage $V_{HVPC}$ from the buffer circuit 17 is inputted to the differential amplifier circuit 19 and to the control circuit 20.

The buffer circuit 18 outputs a voltage equal to an input voltage, and has a function of reducing the impedance of the output side. The buffer circuit 18 is composed of a voltage follower using an operational amplifier AMP3. In place of the voltage follower, a voltage tracker IC or the like may be used to configure the buffer circuit 18. An output voltage $V_{HVNC}$ from the buffer circuit 18 is inputted to the differential amplifier circuit 19 and to the control circuit 20.

Voltages outputted from the buffer circuits 17 and 18 are required to be voltages corresponding to input voltages, but do not always need to be equal to the input voltages.

The differential amplifier circuit 19 detects a difference between the output voltage $V_{HVPC}$ from the buffer circuit 17 and the output voltage $V_{HVNC}$ from the buffer circuit 18, and outputs a differential voltage $V_{HVDC}$ corresponding to the difference, to the control circuit 20. Thus, the differential voltage $V_{HVDC}$ corresponding to a difference between the positive electrode voltage Vp of the positive electrode input terminal 11 and the negative electrode voltage Vn of the negative electrode input terminal 12, that is, corresponding to a voltage of the high-voltage battery 2 is outputted from the differential amplifier circuit 19 and is inputted to the control circuit 20.

The control circuit 20 is a circuit that carries out overall control over the voltage detection circuit 1, and includes, as its functions, a voltage detection unit 20A, a switching signal control unit 20B, and an abnormality detection unit 20C. The control circuit 20 can implement these functions, for example, by running a given program on a microcomputer or using a logic circuit, such as a field-programmable gate array (FPGA).

The voltage detection unit 20A detects the differential voltage $V_{HVDC}$ outputted from the differential amplifier circuit 19, and detects a voltage between the positive electrode and the negative electrode of the high-voltage battery 2, based on the differential voltage $V_{HVDC}$. The voltage detection unit 20A detects also the output voltages $V_{HVPC}$ and $V_{HVNC}$ from the buffer circuits 17 and 18 and the offset voltage Voffset (reference voltage Vref1 or Vref2) outputted from the reference voltage output circuit 13.

The switching signal control unit 20B controls the offset switching signal outputted to the switch element SW1 of the reference voltage output circuit 13 and the normal/diagnosis switching signal outputted to the switch circuit 16. By controlling these switching signals, the switching signal control unit 20B switches the value of the offset voltage Voffset, which is outputted from the reference voltage output circuit 13, to the reference voltage Vref1 or the reference voltage Vref2, and controls switching states of the switch elements SW2-1 and SW2-2 of the switch circuit 16, thereby switching connection of the input terminals of the buffer circuits 17 and 18 to connection to the positive electrode input terminal 11 and the negative electrode input terminal 12 or to connection to the reference voltage output circuit 13.

The abnormality detection unit 20C acquires the output voltages $V_{HVPC}$ and $V_{HVNC}$ from the buffer circuits 17 and 18, the output voltages $V_{HVPC}$ and $V_{HVNC}$ being detected by the voltage detection unit 20A, and the offset voltage Voffset, which is the output voltage from the reference voltage output circuit 13, and detects an abnormality of the voltage detection circuit 1, based on these acquired voltage values. When the abnormality is detected by the abnormality detection unit 20C, the control circuit 20 transmits a given abnormality flag to a high-order device (not illustrated) to inform it of the abnormality having occurred at the voltage detection circuit 1.

Hereinafter, an abnormality detection method by the abnormality detection unit 20C will be described.

FIG. 3 is an expectation value table for diagnosis of amplifier abnormality. The table shown in FIG. 3 indicates what values the reference voltage Vref, the offset voltage Voffset, and the output voltages $V_{HVPC}$ and $V_{HVNC}$ from the buffer circuits 17 and 18 will take, depending on switching states of the switch circuit 16 and the switch element SW1 that are determined by the normal/diagnosis switching signal and the offset switching signal, in a case where the voltage detection circuit 1 is in a normal state and a case where the reference voltage Vref and the operational amplifier AMP1 of the reference voltage output circuit 13 and the operational amplifiers AMP2 and AMP3 of the buffer circuits 17 and 18 are each in an abnormal state.

At execution of normal control under which a voltage of the high-voltage battery 2 is detected, the switching signal control unit 20B outputs the normal/diagnosis switching signal so that the switch circuit 16 switches to a normal side, that is, the input terminals of the buffer circuits 17 and 18 are connected to the positive electrode input terminal 11 and the negative electrode input terminal 12 via the voltage-dividing circuits 14 and 15, respectively. The switching signal control unit 20B outputs also an offset switching signal so that the switch element SW1 of the reference voltage output circuit 13 switches to the off-state and that the reference voltage output circuit 13 outputs the reference voltage Vref1 as the offset voltage Voffset. At this time, when both the reference voltage Vref and the operational amplifiers AMP1 to AMP3 are in the normal state, the voltage detection unit 20A detects the reference voltage Vref1 as the offset voltage Voffset. In addition, a voltage value given by offsetting a voltage-divided voltage value by the reference voltage Vref1 (offset voltage Voffset), the voltage-divided voltage value being obtained by dividing the positive electrode voltage Vp at a voltage-dividing ratio corresponding to the resistor values of the resistors R4 and R5 of the voltage-dividing circuit 14, is detected as the output voltage $V_{HVPC}$ of the buffer circuit 17. Likewise, a voltage value given by offsetting a voltage-divided voltage value by the reference voltage Vref1 (offset voltage Voffset), the voltage-divided voltage value being obtained by dividing the negative electrode voltage Vn at a voltage-dividing ratio corresponding to the resistor values of the resistors R6 and R7 of the voltage-dividing circuit 15, is detected as the output voltage $V_{HVNC}$ of the buffer circuit 18.

At execution of an abnormality diagnosis of the reference voltage Vref and the operational amplifiers AMP1 to AM3, the switching signal control unit 20B outputs the normal/diagnosis switching signal so that the switch circuit 16 switches to a diagnosis side, that is, the input terminals of the buffer circuits 17 and 18 are connected respectively to output terminals of the reference voltage output circuit 13. In this state, the switching signal control unit 20B outputs the offset switching signal so that the switch element SW1 of the reference voltage output circuit 13 is switched between the off-state and the on-state and that in response to switching of the switch element SW1, the reference voltage output circuit 13 outputs the reference voltage Vref1 or Vref2 as the offset voltages Voffset.

When the switch element SW1 of the reference voltage output circuit 13 is in the off-state, if both the reference voltage Vref and the operational amplifiers AMP1 to AMP3 are in the normal state, the voltage detection unit 20A detects the reference voltage Vref1 as the offset voltage Voffset. The reference voltage Vref1 is inputted to the buffer circuits 17 and 18 via the switch circuit 16, and therefore the output voltages $V_{HVPC}$ and $V_{HVNC}$ from the buffer circuits 17 and 18 are each detected as the reference voltage Vref1.

In the reference voltage output circuit 13, however, when an abnormality of the reference voltage Vref occurs because of a failure of the voltage-dividing circuit or the like, the reference voltage Vref becomes different from Vref1, and consequently an output voltage from the reference voltage output circuit 13 becomes different from Vref1. The voltage detection unit 20A, therefore, detects a voltage value different from the reference voltage Vref1, as the offset voltage Voffset. In addition, the output voltages $V_{HVPC}$ and $V_{HVNC}$ from the buffer circuits 17 and 18 are also each detected as a voltage value different from the reference voltage Vref1.

In another case where an abnormality of the operational amplifier AMP1 occurs in the reference voltage output circuit 13, an output voltage from the reference voltage output circuit 13 becomes different from the reference voltage Vref1. In this case, as in the above case of the reference voltage Vref being in the abnormal state, the voltage detection unit 20A detects a voltage value different from the reference voltage Vref1, as the offset voltage Voffset. In addition, the output voltages $V_{HVPC}$ and $V_{HVNC}$ from the buffer circuits 17 and 18 are also each detected as a voltage value different from the reference voltage Vref1.

When an abnormality of the operational amplifier AMP2 occurs at the buffer circuit 17, the voltage detection unit 20A detects a voltage value different from the reference voltage Vref1, as the output voltage $V_{HVPC}$ from the buffer circuit 17. In the same manner, when an abnormality of the operational amplifier AMP3 occurs at the buffer circuit 18, the voltage detection unit 20A detects a voltage value different from the reference voltage Vref1, as the output voltage $V_{HVNC}$ from the buffer circuit 18.

In abnormality diagnosis mode in which an abnormality diagnosis of the reference voltage Vref and the operational amplifiers AMP1 to AMP3 is executed, what is described above applies also to a case where the offset voltage Voffset outputted from the reference voltage output circuit 13 is switched from the reference voltage Vref1 to the reference voltage Vref2, except that Vref1 is replaced with Vref2 in the description. Specifically, when the switch element SW1 of the reference voltage output circuit 13 is in the on-state, if both the reference voltage Vref and the operational amplifiers AMP1 to AMP3 are in the normal state, the voltage detection unit 20A detects the reference voltage Vref2 as the offset voltage Voffset and also detects each of the output voltages $V_{HVPC}$ and $V_{HVNC}$ from the buffer circuits 17 and 18, as the reference voltage Vref2. When either the reference voltage Vref or any one of the operational amplifiers AMP1 to AMP3 is in the abnormal state, on the other hand, a voltage corresponding to a part in the abnormal state is detected as a voltage value different from the reference voltage Vref2.

FIG. 4 is an expectation value table for diagnosis of a switch being fixed to a specific side. The table shown in FIG. 4 indicates what values the reference voltage Vref, the offset voltage Voffset, and the output voltages $V_{HVPC}$ and $V_{HVNC}$ from the buffer circuits 17 and 18 will take, depending on switching states of the switch circuit 16 and the switch element SW1 that are determined by the normal/diagnosis switching signal and the offset switching signal, in a case where the voltage detection circuit 1 is in the normal state and a case where the switch element SW1 of the reference voltage output circuit 13 and the switch elements SW2-1 and SW2-2 of the switch circuit 16 are each in the abnormal state. The table of FIG. 4 shows voltage values in a case of switch elements being in the normal state and a case of switch elements being fixed to a specific side, i.e., in the abnormal state on the assumption that the reference voltage Vref and the operational amplifiers AMP1 to AMP3 are both in the normal state.

At execution of an abnormality diagnosis on the switch elements SW1, SW2-1, and SW2-2, the switching signal control unit 20B outputs the normal/diagnosis switching signal so that the switch circuit 16 switches to the normal side and then to the diagnosis side. The order of switching to the normal side first and then to the diagnosis side may be reversed. In each of the mode of switching to the normal side and the mode of switching to the diagnosis side, the offset switching signal is outputted so that the switch element SW1 of the reference voltage output circuit 13 switches between the off-state and the on-state and that according to the switching of the switch element SW1, the reference voltage output circuit 13 outputs the reference voltage Vref1 or Vref2, as the offset voltages Voffset. At this time, when the switch elements SW1, SW2-1, and SW2-2 are all in the normal state, the voltage detection unit 20A detects the offset voltage Voffset and the output voltages $V_{HVPC}$ and $V_{HVNC}$ from the buffer circuits 17 and 18, as voltages in the normal state shown in the table of in FIG. 3.

However, when the switch element SW1 becomes an abnormal state of fixing to the reference voltage Vref1 side, that is, keeping in the off-state in the reference voltage output circuit 13, even if the offset switching signal is changed when the switch circuit 16 is already connected to the diagnosis side, the value of the reference voltage Vref remains at Vref1 and does not change at all. When the offset switching signal that causes the switch element SW1 to switch to the reference voltage Vref2 side is outputted, therefore, the voltage detection unit 20A detects not the reference voltage Vref2, which is supposed to be detected in this case, but the reference voltage Vref1, as the offset voltage Voffset. Likewise, the output voltages $V_{HVPC}$ and $V_{HVNC}$ from the buffer circuits 17 and 18 are each detected not as the reference voltage Vref2, which is supposed to be detected, but as the reference voltage Vref1.

When the switch element SW1 becomes an abnormal state of fixing to the reference voltage Vref2 side, that is, keeping in the on-state in the reference voltage output circuit 13, even if the offset switching signal is changed when the switch circuit 16 is already connected to the diagnosis side, the value of the reference voltage Vref remains at Vref2 and does not change at all. When the offset switching signal that causes the switch element SW1 to switch to the reference voltage Vref1 side is outputted, therefore, the voltage detection unit 20A detects not the reference voltage Vref1, which is supposed to be detected in this case, but the reference voltage Vref2, as the offset voltage Voffset. Likewise, the output voltages $V_{HVPC}$ and $V_{HVNC}$ from the buffer circuits 17 and 18 are each detected not as the reference voltage Vref1, which is supposed to be detected, but as the reference voltage Vref2.

In another case of abnormality where in the switch circuit 16, the switch element SW2-1 becomes an abnormal state of fixing to the diagnosis side, that is, fixing to the reference voltage output circuit 13 side, even if the normal/diagnosis switching signal is changed, the offset voltage Voffset from the reference voltage output circuit 13 is kept inputted to the buffer circuit 17. When the normal/diagnosis switching signal that causes the switch circuit 16 to switch to the normal side is outputted, therefore, the voltage detection unit 20A does not detect a voltage value corresponding to the positive electrode voltage Vp, which voltage value is supposed to be detected in this case, but detects the reference voltage Vref1 or Vref2 according to the offset switching signal, as the output voltage $V_{HVPC}$ from the buffer circuit 17.

In still another case of abnormality where the switch element SW2-1 becomes an abnormal state of fixing to the normal side, that is, fixing to the positive electrode input terminal 11 side via the voltage-dividing circuit 14, even if the normal/diagnosis switching signal is changed, a voltage given by dividing the positive voltage Vp by the voltage-dividing circuit 14 is kept inputted to the buffer circuit 17. When the normal/diagnosis switching signal that causes the switch circuit 16 to switch to the diagnosis side is outputted, therefore, the voltage detection unit 20A detects a voltage value that is not the reference voltage Vref1 or Vref2 supposed to be detected in this case, as the output voltage $V_{HVPC}$ from the buffer circuit 17.

In still another case of abnormality where in the switch circuit 16, the switch element SW2-2 becomes an abnormal state of fixing to the diagnosis side, that is, fixing to the reference voltage output circuit 13, even if the normal/diagnosis switching signal is changed, the offset Voffset from the reference voltage output circuit 13 is kept inputted to the buffer circuit 18. When the normal/diagnosis switching signal that causes the switch circuit 16 to switch to the normal side is outputted, therefore, the voltage detection unit 20A does not detect a voltage value corresponding to the negative electrode voltage Vn, which voltage value is supposed to be detected in this case, but detects the reference voltage Vref1 or Vref2 according to the offset switching signal, as the output voltage $V_{HVNC}$ from the buffer circuit 18.

In still another case of abnormality where the switch element SW2-2 becomes an abnormal state of fixing to the normal side, that is, fixing to the negative electrode input terminal 12 side via the voltage-dividing circuit 15, even if the normal/diagnosis switching signal is changed, a voltage given by dividing the negative electrode voltage Vn by the voltage-dividing circuit 15 is kept inputted to the buffer circuit 18. When the normal/diagnosis switching signal that causes the switch circuit 16 to switch to the diagnosis side is outputted, therefore, the voltage detection unit 20A detects a voltage value that is not the reference voltage Vref1 or Vref2 supposed to be detected in this case, as the output voltage $V_{HVNC}$ from the buffer circuit 18.

In the control circuit 20, both the reference voltages Vref1 and Vref2 of the reference voltage output circuit 13 can be stored as known values. When the normal/diagnosis switching signal and the offset switching signal are changed, the abnormality detection unit 20C acquires voltage values detected by the voltage detection unit 20A, that is, the values of the offset voltage Voffset and the output voltages $V_{HVPC}$ and $V_{HVNC}$ from the buffer circuits 17 and 18, and compares the acquired voltage values with expectation values on the expectation value tables of FIGS. 3 and 4. When a voltage value different from a voltage value in the normal state is found as a result of the comparison, it can be determined, according to reference to these expectation value tables, that any one of the circuits making up the voltage detection circuit 1 is in the abnormal state.

Figure 5:
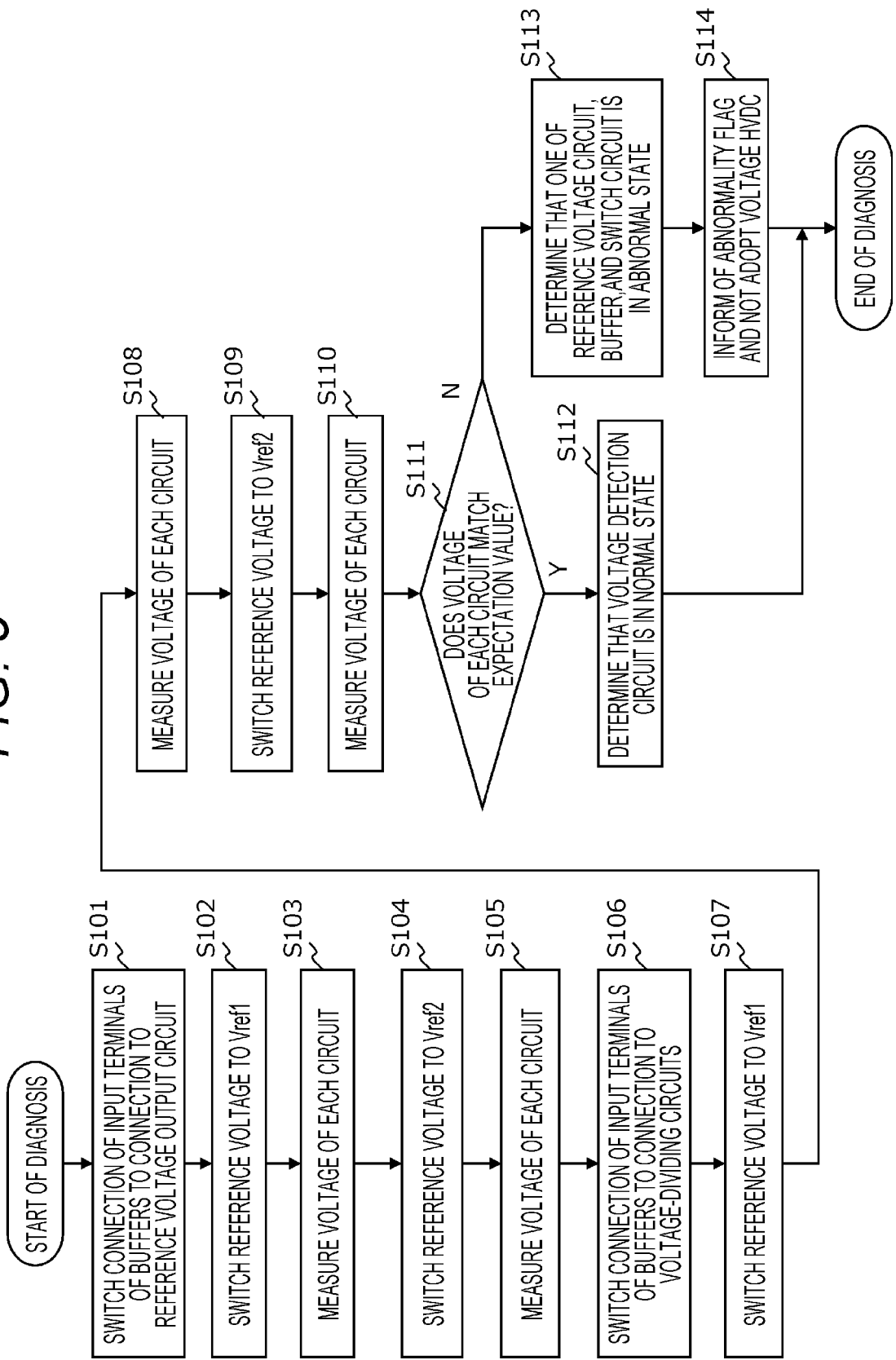
FIG. 5 is a flowchart showing a procedure of an abnormality diagnosis.

FIG. 5 is a flowchart showing a procedure of an abnormality diagnosis executed by the control circuit 20.

At step S101, connection of the input terminals of the buffer circuits 17 and 18 are switched to connection to the reference voltage output circuit 13. At this step, the switching signal control unit 20B outputs the normal/diagnosis switching signal so that the switch circuit 16 switches to the diagnosis side, thus switching connection of the input terminals of the buffer circuits 17 and 18.

At step S102, the reference voltage in the reference voltage output circuit 13 is switched to Vref1. At this step, the switching signal control unit 20B outputs the offset switching signal so that the switch element SW1 switches to the off-state in the reference voltage output circuit 13 and that in response to switching of the switch element SW1, the reference voltage output circuit 13 outputs the reference voltage Vref1 as the offset voltage Voffset.

At step S103, the voltage detection unit 20A measures a voltage of each circuit. At this step, the voltage detection unit 20A measures the value of the offset voltage Voffset outputted from the reference voltage output circuit 13 and the output voltages $V_{HVPC}$ and $V_{HVNC}$ from the buffer circuits 17 and 18.

At step S104, the reference voltage in the reference voltage output circuit 13 is switched to Vref2. At this step, the switching signal control unit 20B outputs the offset switching signal so that the switch element SW1 switches to the on-state in the reference voltage output circuit 13 and that in response to switching of the switch element SW1, the reference voltage output circuit 13 outputs the reference voltage Vref2 as the offset voltage Voffset.

At step S105, the voltage detection unit 20A measures the value of the offset voltage Voffset outputted from the reference voltage output circuit 13 and the output voltages $V_{HVPC}$ and $V_{HVNC}$ from the buffer circuits 17 and 18.

At step S106, connection of the input terminals of the buffer circuits 17 and 18 are switched to connection to the voltage-dividing circuits 14 and 15. At this step, the switching signal control unit 20B outputs the normal/diagnosis switching signal so that the switch circuit 16 switches to the normal side, thus switching connection of the input terminals of the buffer circuits 17 and 18.

At step S107, the reference voltage in the reference voltage output circuit 13 is switched to Vref1, as is at step S102.

At step S108, the voltage detection unit 20A measures the value of the offset voltage Voffset outputted from the reference voltage output circuit 13 and the output voltages $V_{HVPC}$ and $V_{HVNC}$ from the buffer circuits 17 and 18.

At step S109, the reference voltage in the reference voltage output circuit 13 is switched to Vref2, as is at step S104.

At step S110, the voltage detection unit 20A measures the value of the offset voltage Voffset outputted from the reference voltage output circuit 13 and the output voltages $V_{HVPC}$ and $V_{HVNC}$ from the buffer circuits 17 and 18.

At step S111, the abnormality detection unit 20C determines whether voltages of circuits measured at steps S103, S105, S108, and S110 match expectation values in various cases shown in the expectation value tables of FIGS. 3 and 4, respectively. When these voltages measured respectively at the above steps all match the expectation values, the procedure flow proceeds to step S112. When at least one of the voltages is different from the corresponding expectation value, the procedure flow proceeds to step S113.

At step S112, the abnormality detection unit 20C determines that the voltage detection circuit 1 is in the normal state. When step S112 is over, the abnormality diagnosis procedure shown in the flowchart of FIG. 5 comes to an end, and voltage detection on the high-voltage battery 2 by the voltage detection circuit 1 is continued. However, by the abnormality diagnosis procedure shown in FIG. 5, whether the differential amplifier circuit 19, which is one of the circuits making up the voltage detection circuit 1, is in the normal state or abnormal state cannot be determined. It is therefore preferable that following the end of the flowchart of FIG. 5, diagnosis of amplifier abnormality, which is shown in FIG. 6 to be referred to later, be executed to determine whether the differential amplifier circuit 19 is in the normal state or abnormal state.

At step S113, the abnormality detection unit 20C determines that in the voltage detection circuit 1, one of the reference voltage output circuit 13, the buffer circuits 17 and 18, and the switch circuit 16 is in the abnormal state. At this time, an item the abnormal state corresponds to in the expectation value tables of FIGS. 3 and 4 may be determined. By this process, which part is in the abnormal state can be determined.

At step S114, an abnormality flag is sent to a high-order device (not illustrated) to inform it of occurrence of an abnormality at the voltage detection circuit 1. In addition, a measurement result of the differential voltage $V_{HVDC}$ outputted from the differential amplifier circuit 19 is not adopted and is not outputted to a different device. As a result, when an abnormality occurs at the voltage detection circuit 1, executing improper control based on output from the voltage detection circuit 1 at a different device is prevented, which ensures the safety of a system, such as a vehicle, in which the voltage detection circuit 1 is incorporated. When step S114 is over, the abnormality diagnosis procedure shown in the flowchart of FIG. 5 comes to an end.

Figure 6:
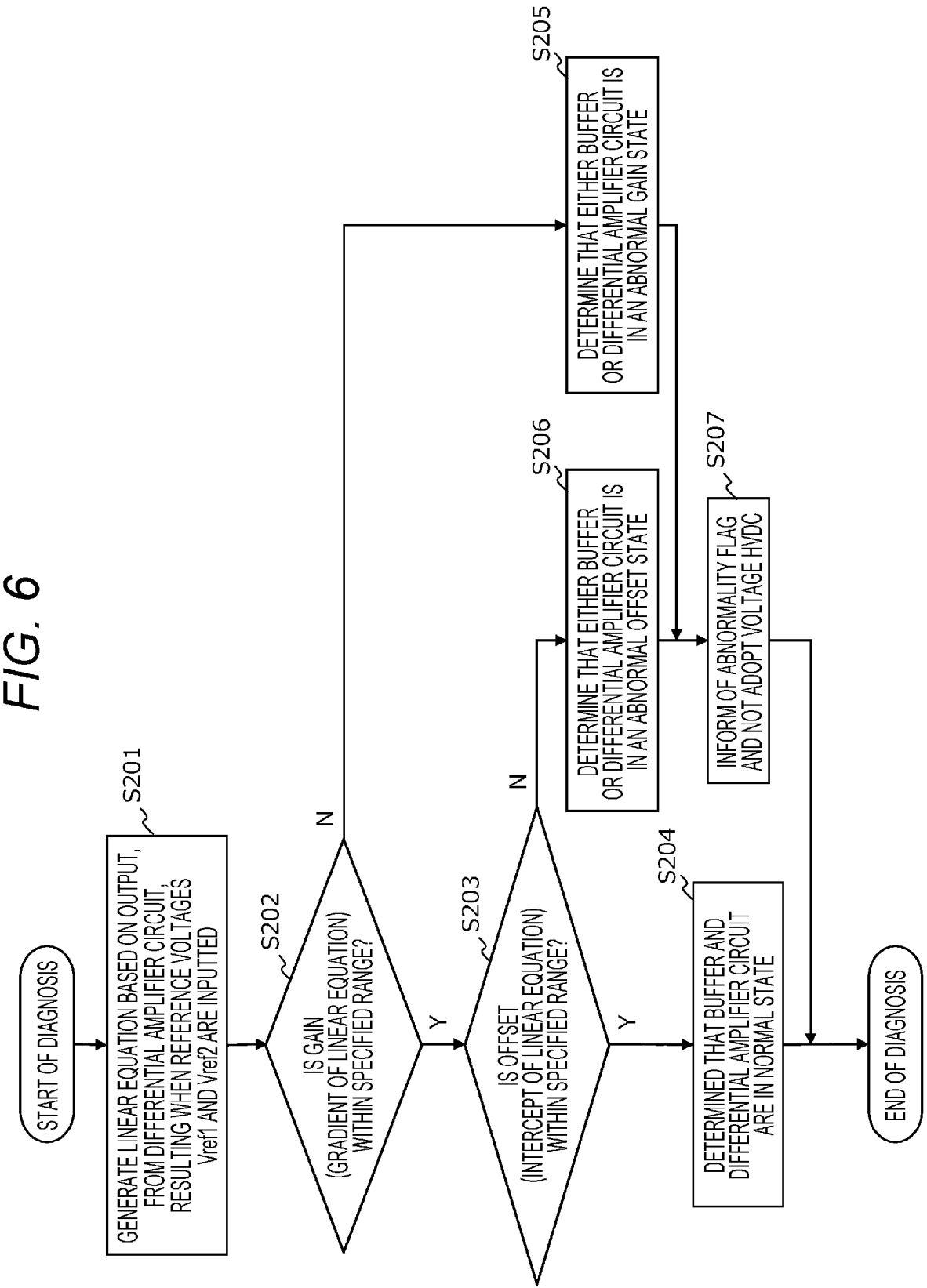
FIG. 6 is a flowchart showing a procedure of diagnosis of amplifier abnormality.

FIG. 6 is a flowchart showing a procedure of diagnosis of an amplifier abnormality executed by the control circuit 20.

At step S201, based on output from the differential amplifier circuit 19, the output resulting when the reference voltage Vref1 is inputted to the buffer circuits 17 and 18, and on output from the differential amplifier circuit 19, the output resulting when the reference voltage Vref2 is inputted to the buffer circuits 17 and 18, a linear equation expressing a relationship between the input voltage Vin to the buffer circuits 17 and 18 and the differential voltage $V_{HVDC}$ outputted from the differential amplifier circuit 19 is generated.

At step S201, in the same manner as at steps S101 and S102 in FIG. 5, the switching signal control unit 20B outputs the normal/diagnosis switching signal so that the switch circuit 16 switches to the diagnosis side, and outputs the offset switching signal so that the switch element SW1 switches to the off-state in the reference voltage output circuit 13 to cause it to output the reference voltage Vref1. At this time, the voltage detection unit 20A acquires output from the differential amplifier circuit 19, as a first differential voltage $V_{HVDC1}$ corresponding to the reference voltage Vref1. Subsequently, in the same manner as at steps S104 and S105 in FIG. 5, the switching signal control unit 20B changes the offset switching signal without changing the normal/diagnosis switching signal, and consequently the switch element SW1 switches to the on-state in the reference voltage output circuit 13 to cause it to output the reference voltage Vref2. At this time, the voltage detection unit 20A acquires output from the differential amplifier circuit 19, as a second differential voltage $V_{HVDC2}$ corresponding to the reference voltage Vref2.

When the first differential voltage $V_{HVDC1}$ and the second differential voltage $V_{HVDC2}$ are acquired in this manner, a linear equation shown below as equation (1) is generated. In equation (1), $V_{HVDC}$ represents a differential voltage outputted from the differential amplifier circuit 19, and Vin represents a voltage inputted to the buffer circuits 17 and 18. A and B represent the gradient and the intercept of the linear equation, respectively, which correspond respectively to the gain of the buffer circuits 17 and 18 and the offset of the differential amplifier circuit 19.

$$V_{HVDC} = A \cdot Vin + B \quad (1)$$

Respective values of the gradient A and the intercept B in equation (1) are given by the following equations (2) and (3).

$$A = (V_{HVDC2} - V_{HVDC1})/(Vref2 - Vref1) \quad (2)$$

$$B = V_{HVDC1} - A \cdot Vref1 = V_{HVDC2} - A \cdot Vref2 \quad (3)$$

At step S202, the abnormality detection unit 20C determines whether the value of the gradient A, i.e., gain of the linear equation generated at step S201 is within a specified range stored in advance. When the value of the gradient A is within the specified range, the procedure flow proceeds to step S203, and when the same is out of the specified range, the procedure flow proceeds to step S205.

At step S203, the abnormality detection unit 20C determines whether the value of the intercept B, i.e., offset of the linear equation generated at step S201 is within a specified range stored in advance. When the value of the intercept B is within the specified range, the procedure flow proceeds to step S204, and when the same is out of the specified range, the procedure flow proceeds to step S206.

At step S204, the abnormality detection unit 20C determines that in the voltage detection circuit 1, the buffer circuits 17 and 18 and the differential amplifier circuit 19 are in the normal state. When step S204 is over, the diagnosis of amplifier abnormality shown in the flowchart of FIG. 6 comes to an end, and voltage detection on the high-voltage battery 2 by the voltage detection circuit 1 is continued.

At step S205, the abnormality detection unit 20C determines that in the voltage detection circuit 1, one of the buffer circuits 17 and 18 and the differential amplifier circuit 19 is in a state of gain abnormality. When the state of gain abnormality is determined at step S205, the procedure flow proceeds to step S207.

At step S206, the abnormality detection unit 20C determines that in the voltage detection circuit 1, one of the buffer circuits 17 and 18 and the differential amplifier circuit 19 is in a state of offset abnormality. When the state of offset abnormality is determined at step S206, the procedure flow proceeds to step S207.

At step S207, in the same manner at step S114 in FIG. 5, an abnormality flag is sent to the high-order device (not illustrated) to inform it of occurrence of an abnormality at the voltage detection circuit 1. In addition, a measurement result of the differential voltage $V_{HVDC}$ outputted from the differential amplifier circuit 19 is not adopted and is not outputted to a different device. When step S207 is over, the diagnosis of amplifier abnormality shown in the flowchart of FIG. 6 comes to an end.

The first embodiment of the present invention described above offers the following effects.

(1) The voltage detection circuit 1 includes the buffer circuit 17 and the buffer circuit 18 that each output a voltage corresponding to an input voltage, the voltage detection unit 20A that detects the output voltage $V_{HVPC}$ from the buffer circuit 17 and the output voltage $V_{HVNC}$ from the buffer circuit 18, the reference voltage output circuit 13 that can selectively output one of the reference voltages Vref1 and Vref2 different in voltage value from each other, and the switch circuit 16 connected to the buffer circuit 17 and to the buffer circuit 18. The switch circuit 16 switches an input voltage to the buffer circuit 17, from the input voltage corresponding to the voltage Vp of the positive electrode input terminal 11 connected to the high-voltage battery 2, which is a measurement target, to the reference voltage Vref1 or Vref2 outputted from the reference voltage output circuit 13, and switches an input voltage to the buffer circuit 18, from the input voltage corresponding to the voltage Vn of the negative electrode input terminal 12 connected to the high-voltage battery 2 to the reference voltage Vref1 or Vref2 outputted from the reference voltage output circuit 13 (step S101). According to this configuration, the voltage detection circuit that can execute more various abnormality diagnoses than in conventional cases, using the values of the output voltage $V_{HVPC}$ and output voltage $V_{HVNC}$ detected by the voltage detection unit 20A, can be provided.

(2) The voltage detection circuit 1 includes the voltage-dividing circuit 14 that is connected between the positive electrode input terminal 11 and the reference voltage output circuit 13 and that outputs a voltage given by dividing the voltage Vp of the positive electrode input terminal 11 at a given voltage-dividing ratio, and the voltage-dividing circuit 15 that is connected between the negative electrode input terminal 12 and the reference voltage output circuit 13 and that outputs a voltage given by dividing the voltage Vn of the negative electrode input terminal 12 at a given voltage-dividing ratio. An output voltage from the voltage-dividing circuit 14 is inputted to the buffer circuit 17, as an input voltage, and an output voltage from the voltage-dividing circuit 15 is inputted to the buffer circuit 18, as an input voltage. According to this configuration, the value of the output voltage $V_{HVPC}$ and that of the output voltage $V_{HVNC}$ can be adjusted in accordance with a range of voltages the voltage detection unit 20A of the control circuit 20 can handle. With no additional circuit configuration, therefore, the voltage detection unit 20A is able to acquire the output voltages $V_{HVPC}$ and $V_{HVNC}$.

(3) The reference voltage output circuit 13 includes the resistance circuit composed of the resistors R1, R2, and R3 connected in series, the resistance circuit having a given source voltage applied thereto, and the switch element SW1 that switches a connection state of at least one of these resistors. The reference voltage output circuit 13 is configured to be able to select one of the reference voltages Vref1 and Vref2 through switching on and off of the switch element SW1. According to this configuration, the reference voltage output circuit 13 capable of selectively outputting one of a plurality of reference voltages different in voltage values from each other can be provided, using a simple circuit configuration.

Figure 2A:
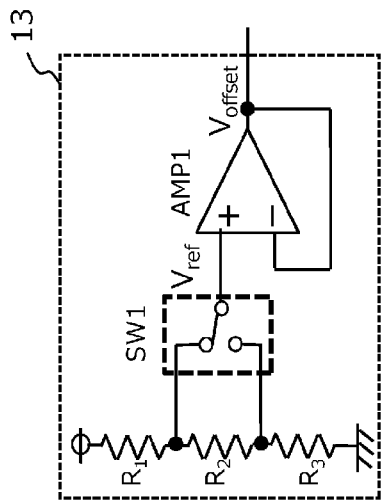
FIGS. 2A-2D depict various configuration examples of a reference voltage output circuit.
Figure 2B:
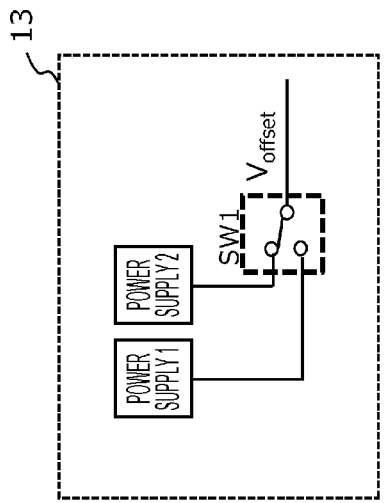
Figure 2C:
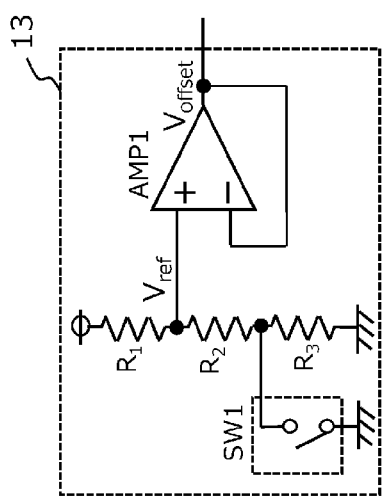
Figure 2D:
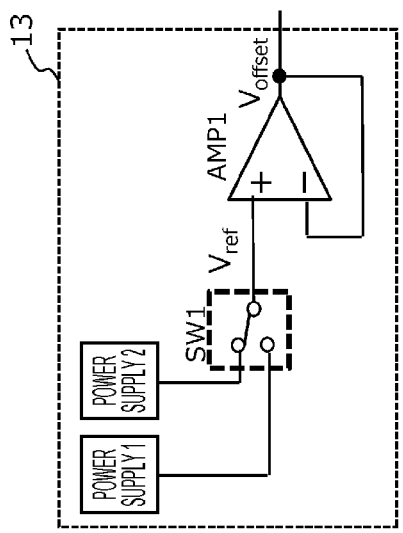

(4) As shown in FIGS. 2C and 2D, the reference voltage output circuit 13 may include a plurality of power supply circuits that output different source voltages, and the switch element SW1 that switches connection of these power supply circuits to their output destinations. The reference voltage output circuit 13 may be configured to be able to select one of the reference voltages Vref1 and Vref2 through switching of the switch element SW1. According to this configuration, as in the above cases, the reference voltage output circuit 13 capable of selectively outputting one of a plurality of reference voltages different in voltage values from each other can be provided, using a simple circuit configuration.

(5) The switch circuit 16 includes the switch element SW2-1 that switches connection of the input terminal of the buffer circuit 17, to connection to the positive electrode input terminal 11 or connection to the reference voltage output circuit 13, and a switch element SW2-2 that switches connection of the input terminal of the buffer circuit 18, to connection to the negative electrode input terminal 12 or connection to the reference voltage output circuit 13. According to this configuration, the switch circuit 16 capable of arbitrarily switching input voltages to the buffer circuits 17 and 18 can be provided, using a simple circuit configuration.

(6) The voltage detection circuit 1 includes the abnormality detection unit 20C that detects an abnormality of the voltage detection circuit 1. When an input voltage to the buffer circuit 17 and an input voltage to the buffer circuit 18 are each switched by the switch circuit 16 to the reference voltage Vref1 or Vref2 outputted from the reference voltage output circuit 13, the abnormality detection unit 20C determines whether the voltage detection circuit 1 is in the abnormal state, based on at least one of the output voltage $V_{HVPC}$ from the buffer circuit 17 and the output voltage $V_{HVNC}$ from the buffer circuit 18, the output voltages $V_{HVPC}$ and $V_{HVNC}$ being detected by the voltage detection unit 20A, and when an input voltage to the buffer circuit 17 is switched by the switch circuit 16 to the input voltage corresponding to the positive electrode voltage Vp as an input voltage to the buffer circuit 18 is switched by the switch circuit 16 to the input voltage corresponding to the negative electrode voltage Vn, the abnormality detection unit 20C determines whether the voltage detection circuit 1 is in the abnormal state, based on at least one of the output voltage $V_{HVPC}$ from the buffer circuit 17 and the output voltage $V_{HVNC}$ from the buffer circuit 18, the output voltages $V_{HVPC}$ and $V_{HVNC}$ being detected by the voltage detection unit 20A (steps S111 to S113). Specifically, when the input voltage to the buffer circuit 17 and the input voltage to the buffer circuit 18 are each switched by the switch circuit 16 to the reference voltage Vref1 or Vref2, the abnormality detection unit 20C acquires the output voltage $V_{HVPC}$ from the buffer circuit 17 and the output voltage $V_{HVNC}$ from the buffer circuit 18, the output voltages $V_{HVPC}$ and $V_{HVNC}$ being detected by the voltage detection unit 20A, for the reference voltages Vref1 and Vref2 (steps S103 and S105). When the input voltage to the buffer circuit 17 is switched by the switch circuit 16 to the input voltage corresponding to the positive electrode voltage Vp as the input voltage to the buffer circuit 18 is switched by the switch circuit 16 to the input voltage corresponding to the negative electrode voltage Vn, the abnormality detection unit 20C acquires the output voltage $V_{HVPC}$ from the buffer circuit 17 and the output voltage $V_{HVNC}$ from the buffer circuit 18, the output voltages $V_{HVPC}$ and $V_{HVNC}$ being detected by the voltage detection unit 20A, for the reference voltages Vref1 and Vref2 (steps S108 and S110). Based on the acquired output voltage values, the abnormality detection unit 20C then determines whether the voltage detection circuit 1 has an abnormality (steps S111 to S113). According to this configuration, when an abnormality occurs at any one of the reference voltage output circuit 13, the buffer circuits 17 and 18, and the switch circuit 16 in the voltage detection circuit 1, the abnormality can certainly be detected.

(7) The voltage detection circuit 1 includes the differential amplifier circuit 19 that outputs a voltage corresponding to a difference between an output voltage from the buffer circuit 17 and an output voltage from the buffer circuit 18, and an abnormality detection unit 20C that detects an abnormality of the voltage detection circuit 1. The voltage detection unit 20A detects the differential voltage $V_{HVDC}$ which is an output voltage from the differential amplifier circuit 19. When input voltages to the buffer circuit 17 and the buffer circuit 18 are each switched by the switch circuit 16 to the reference voltage Vref1 or Vref2 outputted from the reference voltage output circuit 13 and the reference voltage Vref1 or Vref2 outputted from the reference voltage output circuit 13 is switched to Vref2 or Vref1, the abnormality detection unit 20C determines whether the voltage detection circuit 1 has an abnormality, based on the linear equation generated from the differential voltages $V_{HVDC1}$ and $V_{HVDC2}$ detected by the voltage detection unit 20A (steps S201 to S206). According to this configuration, when a gain abnormality or an offset abnormality occurs at any one of the buffer circuits 17 and 18 and the differential amplifier circuit 19 in the voltage detection circuit 1, the gain abnormality or the offset abnormality can certainly be detected.

Second Embodiment

A second embodiment of the present invention will hereinafter be described with reference to FIG. 7.

Figure 7:
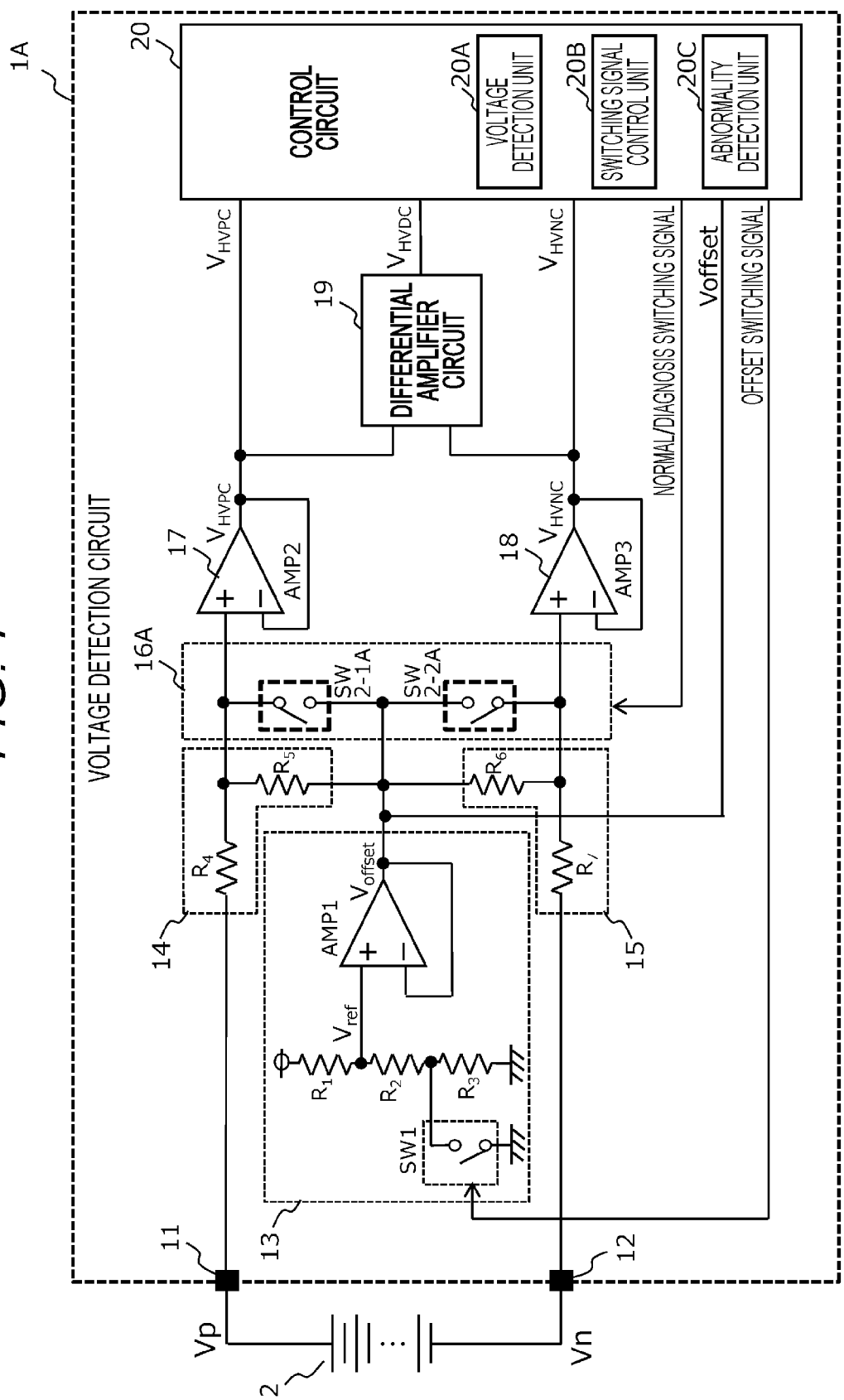
FIG. 7 is a configuration diagram of a voltage detection circuit according to a second embodiment of the present invention.

FIG. 7 is a configuration diagram of a voltage detection circuit according to the second embodiment of the present invention. A voltage detection circuit 1A according to this embodiment is different from the voltage detection circuit 1 of FIG. 1 described in the first embodiment in that the voltage detection circuit 1A includes a switch circuit 16A in place of the switch circuit 16, the switch circuit 16A being different in circuit configuration from the switch circuit 16. Except for this respect, the voltage detection circuit 1A is identical in configuration with the voltage detection circuit 1.

The switch circuit 16A includes a switch element SW2-1A and a switch element SW2-2A.

The switch element SW2-1A has one end connected to a node between the voltage-dividing circuit 14 and the buffer circuit 17 and the other end connected to the output side of the reference voltage output circuit 13. According to the normal/diagnosis switching signal outputted from the control circuit 20, the switch element SW2-1A switches a connection state between the input terminal of the buffer circuit 17 and the reference voltage output circuit 13. Now, the output impedance of the reference voltage output circuit 13 is sufficiently lower than the impedance of the voltage-dividing circuit 14. Because of this, as a result of switching operation of the switch element SW2-1A, either a voltage given by dividing the positive electrode voltage Vp of the positive electrode input terminal 11 by the voltage-dividing circuit 14 or the offset voltage Voffset (reference voltage Vref1 or Vref2) outputted from the reference voltage output circuit 13 is selected as an input voltage to the buffer circuit 17. In other words, the same switching operation as the switch element SW2-1 described in the first embodiment does can be executed without breaking the connection between the voltage-dividing circuit 14 and the buffer circuit 17.

The switch element SW2-2A has one end connected to a node between the voltage-dividing circuit 15 and the buffer circuit 18 and the other end connected to the output side of the reference voltage output circuit 13. According to the normal/diagnosis switching signal outputted from the control circuit 20, the switch element SW2-2A switches a connection state between the input terminal of the buffer circuit 18 and the reference voltage output circuit 13. Now the output impedance of the reference voltage output circuit 13 is sufficiently lower than the impedance of the voltage-dividing circuit 15. Because of this, as a result of switching operation of the switch element SW2-2A, either a voltage given by dividing the negative electrode voltage Vn of the negative electrode input terminal 12 by the voltage-dividing circuit 15 or the offset voltage Voffset (reference voltage Vref1 or Vref2) outputted from the reference voltage output circuit 13 is selected as an input voltage to the buffer circuit 18. In other words, the same switching operation as the switch element SW2-2 described in the first embodiment does can be executed without breaking the connection between the voltage-dividing circuit 15 and the buffer circuit 18.

As described above, according to the second embodiment of the present invention, the switch circuit 16A includes the switch element SW2-1A that switches the connection state between the input terminal of the buffer circuit 17 and the reference voltage output circuit 13, and the switch element SW2-2A that switches the connection state between the input terminal of the buffer circuit 18 and the reference voltage output circuit 13. According to this configuration, in the same manner as in the first embodiment, the switch circuit 16A capable of arbitrarily switching input voltages to the buffer circuits 17 and 18 can be provided, using a simple circuit configuration.

Third Embodiment

A third embodiment of the present invention will hereinafter be described with reference to FIGS. 8 and 9.

Figure 8:
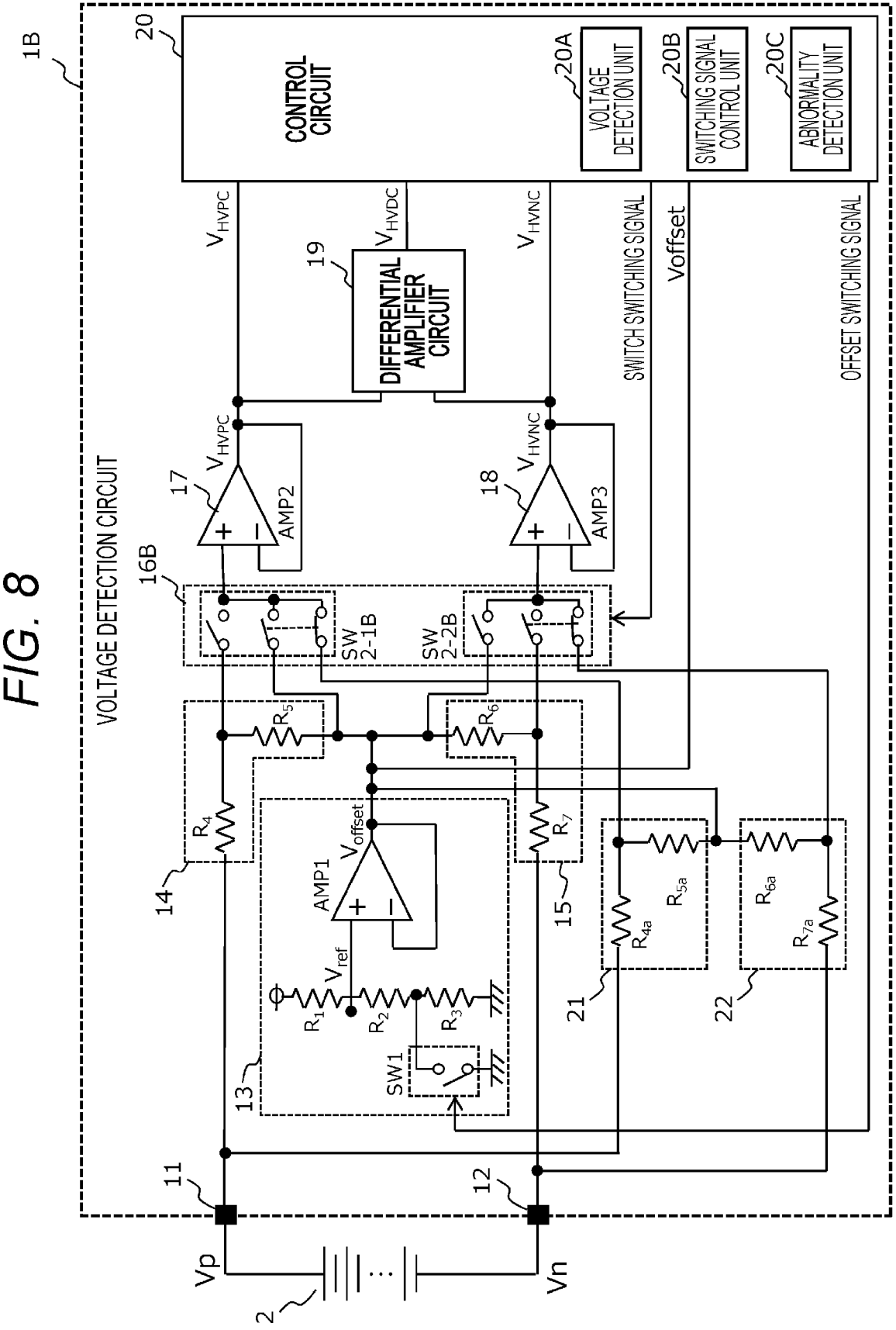
FIG. 8 is a configuration diagram of a voltage detection circuit according to a third embodiment of the present invention.

FIG. 8 is a configuration diagram of a voltage detection circuit according to the third embodiment of the present invention. A voltage detection circuit 1B according to this embodiment is different from the voltage detection circuit 1 of FIG. 1 described in the first embodiment in that the voltage detection circuit 1B includes a switch circuit 16B in place of the switch circuit 16, the switch circuit 16B being different in circuit configuration from the switch circuit 16, and voltage-dividing circuits 21 and 22 as well. Except for this respect, the voltage detection circuit 1A is identical in configuration with the voltage detection circuit 1.

The voltage-dividing circuit 21 is composed of a resistor R4a and a resistor R5a, and is connected between the positive electrode input terminal 11 and the reference voltage output circuit 13 in parallel with the voltage-dividing circuit 14. To a node between the resistor R4a and the resistor R5a, the buffer circuit 17 is connected via the switch circuit 16B. The positive electrode voltage Vp inputted to the positive electrode input terminal 11 is divided by the voltage-dividing circuit 21 at a given voltage-dividing ratio, and is outputted to the buffer circuit 17 via the switch circuit 16B. The voltage-dividing circuit 21 has the voltage-dividing ratio set equal to the voltage-dividing ratio of the voltage-dividing circuit 14.

The voltage-dividing circuit 22 is composed of a resistor R6a and a resistor R7a, and is connected between the negative electrode input terminal 12 and the reference voltage output circuit 13 in parallel with the voltage-dividing circuit 15. To a node between the resistor R6a and the resistor R7a, the buffer circuit 18 is connected via the switch circuit 16B. The negative electrode voltage Vn inputted to the negative electrode input terminal 12 is divided by the voltage-dividing circuit 22 at a given voltage-dividing ratio, and is outputted to the buffer circuit 18 via the switch circuit 16B. The voltage-dividing circuit 22 has the voltage-dividing ratio set equal to the voltage-dividing ratio of the voltage-dividing circuit 15.

The switch circuit 16B includes a switch element group SW2-1B and a switch element group SW2-2B.

The switch element group SW2-1B is composed of three switch elements. One ends of the three switch elements are connected to a node between the resistor R4 and the resistor R5 of the voltage-dividing circuit 14, the reference voltage output circuit 13, and a node between the resistor R4a and the resistor R5a of the voltage-dividing circuit 21, respectively, while the other ends of the same are connected to the input side of the buffer circuit 17. At the switch element group SW2-1B, these three switch elements each switch between the on-state and the off-state according to the normal/diagnosis switching signal outputted from the control circuit 20, thus switching connection of the input terminal of the buffer circuit 17, to connection to the voltage-dividing circuit 14, to connection to the reference voltage output circuit 13, or to connection to the voltage-dividing circuit 21. As a result of this switching operation of the switch element group SW2-1B, either a voltage given by dividing the positive electrode voltage Vp of the positive electrode input terminal 11 by the voltage-dividing circuit 14 or the voltage-dividing circuit 21 or the offset voltage Voffset (reference voltage Vref1 or Vref2) outputted from the reference voltage output circuit 13 is selected as an input voltage to the buffer circuit 17.

The switch element group SW2-2B is composed of three switch elements. One ends of the three switch elements are connected to a node between the resistor R6 and the resistor R7 of the voltage-dividing circuit 15, the reference voltage output circuit 13, and a node between the resistor R6a and the resistor R7a of the voltage-dividing circuit 22, respectively, while the other ends of the same are connected to the input side of the buffer circuit 18. At the switch element group SW2-2B, these three switch elements each switch between the on-state and the off-state according to the normal/diagnosis switching signal outputted from the control circuit 20, thus switching connection of the input terminal of the buffer circuit 18, to connection to the voltage-dividing circuit 15, to connection to the reference voltage output circuit 13, or to connection to the voltage-dividing circuit 22. As a result of this switching operation of the switch element group SW2-2B, either a voltage given by dividing the negative electrode voltage Vn of the negative electrode input terminal 12 by the voltage-dividing circuit 15 or the voltage-dividing circuit 22 or the offset voltage Voffset (reference voltage Vref1 or Vref2) outputted from the reference voltage output circuit 13 is selected as an input voltage to the buffer circuit 18.

In addition to execution of the abnormality diagnosis described in the first embodiment, the voltage detection circuit 1B according to this embodiment switches connection of the buffer circuits 17 and 18 between connection to the voltage-dividing circuits 14 and 15 and connection to the voltage dividing-circuits 21 and 22, using the switch circuit 16B, thus being able to make an abnormality diagnosis on these voltage-dividing circuits. Hereinafter, a procedure of this abnormality diagnosis will be described.

Figure 9:
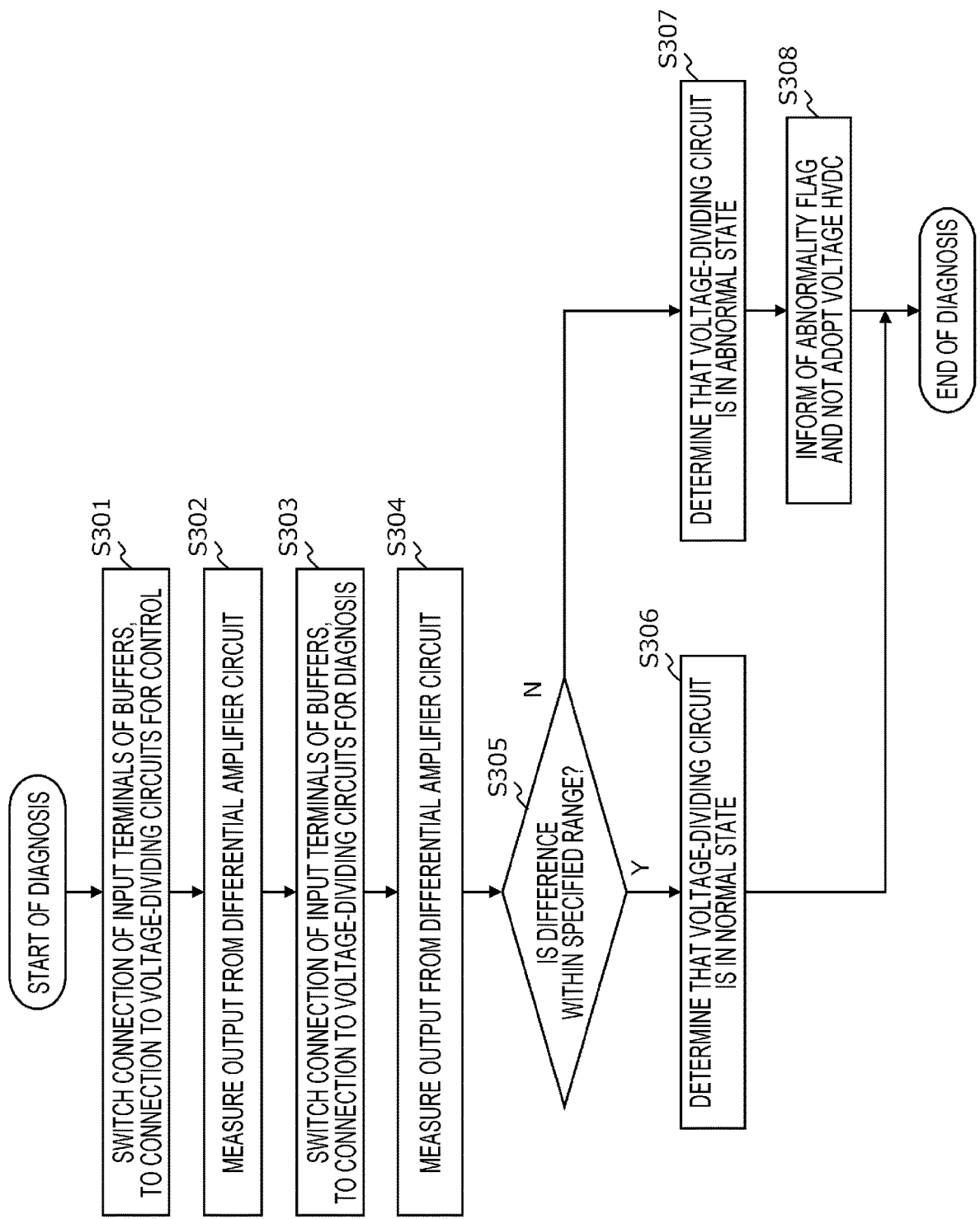
FIG. 9 is a flowchart showing a procedure of abnormality diagnosis on a voltage-dividing circuit.

FIG. 9 is a flowchart showing a procedure of abnormality diagnosis on the voltage-dividing circuit, the abnormality diagnosis being executed by the control circuit 20.

At step S301, connection of the input terminals of the buffer circuits 17 and 18 is switched to connection to the voltage-dividing circuits 14 and 15. At this step, the switching signal control unit 20B outputs the normal/diagnosis switching signal so that in the switch circuit 16B, switch elements connected to the voltage-dividing circuits 14 and 15, the switch elements being a part of the switch element groups SW2-1B and SW2-2B, are each switched on while the other switch elements making up the rest of the switch element groups are each switched off. This switches connection of the input terminals of the buffer circuits 17 and 18 to connection to the voltage-dividing circuits 14 and 15.

At step S302, the voltage detection unit 20A measures the differential voltage $V_{HVDC}$ outputted from the differential amplifier circuit 19.

At step S303, connection of the input terminals of the buffer circuits 17 and 18 are switched to connection to the voltage-dividing circuits 21 and 22 for diagnosis. At this step, the switching signal control unit 20B outputs the normal/diagnosis switching signal so that in the switch circuit 16B, switch elements connected to the voltage-dividing circuits 21 and 22, the switch elements being a part of the switch element groups SW2-1B and SW2-2B, are each switched on while the other switch elements making up the rest of the switch element groups are each switched off. This switches connection of the input terminals of the buffer circuits 17 and 18 to connection to the voltage-dividing circuits 21 and 22.

At step S304, the voltage detection unit 20A measures the differential voltage $V_{HVDC}$ outputted from the differential amplifier circuit 19.

At step S305, the abnormality detection unit 20C determines whether a difference between the differential voltage $V_{HVDC}$ measured at step S302 and the differential voltage $V_{HVDC}$ measured at step and S304 is within a specified range stored in advance. When the difference between both differential voltages $V_{HVDC}$ is within the specified range, the procedure flow proceeds to step S306, and when the difference is outside the specified range, the procedure flow proceeds to step S307.

At step S306, the abnormality detection unit 20C determines that the voltage-dividing circuits 14 and 15 and the voltage-dividing circuits 21 and 22 are in the normal state in the voltage detection circuit 1B. When step S306 is over, the abnormality diagnosis on the voltage-dividing circuit shown in the flowchart of FIG. 9 comes to an end, and voltage detection on the high-voltage battery 2 by the voltage detection circuit 1B is continued.

At step S307, the abnormality detection unit 20C determines that in the voltage detection circuit 1B, one of the voltage-dividing circuits 14 and 15 and the voltage-dividing circuits 21 and 22 is in the abnormal state.

At step S308, in the same manner at step S114 in FIG. 5 or step S207 in FIG. 6, an abnormality flag is sent to the high-order device (not illustrated) to inform it of occurrence of an abnormality at the voltage detection circuit 1B. In addition, a measurement result of the differential voltage $V_{HVDC}$ outputted from the differential amplifier circuit 19 is not adopted and is not outputted to a different device. When step S308 is over, the abnormality diagnosis on the voltage-dividing circuit shown in the flowchart of FIG. 9 comes to an end.

As described above, according to the third embodiment of the present invention, the voltage detection circuit 1B includes the voltage-dividing circuit 21 that is connected between the positive electrode input terminal 11 and the reference voltage output circuit 13 in parallel with the voltage-dividing circuit 14 and that outputs the voltage given by dividing the voltage Vp of the positive electrode input terminal 11 at the given voltage-dividing ratio, and the voltage-dividing circuit 22 that is connected between the negative electrode input terminal 12 and the reference voltage output circuit 13 in parallel with the voltage-dividing circuit 15 and that outputs the voltage given by dividing the voltage Vn of the negative electrode input terminal 12 at the given voltage-dividing ratio. The voltage detection circuit 1B switches a connection state of the switch circuit 16B so that an output voltage from the voltage-dividing circuit 14 or the voltage-dividing circuit 21 is inputted to the buffer circuit 17 as an input voltage and that an output voltage from the voltage-dividing circuit 15 or the voltage-dividing circuit 22 is inputted to the buffer circuit 18 as an input voltage. According to this configuration, a voltage detection circuit capable of executing abnormality diagnosis on the voltage-dividing circuits 14 and 15 and the voltage-dividing circuits 21 and 22 can be provided.

The embodiments and modifications described above are examples. The present invention is not limited to these embodiment and modifications and may be implemented in other forms on condition that the features of the invention are not impaired. Various embodiments and modifications have been described above, but the present invention is not limited by the descriptive contents of these embodiments and modifications. Other modes/aspects that are conceivable in the range of the technical concept of the present invention are also included in the scope of the present invention.

REFERENCE SIGNS LIST 1, 1A, 1B voltage detection circuit
2 high-voltage battery
11 positive electrode input terminal
12 negative electrode input terminal
13 reference voltage output circuit
14, 15 voltage-dividing circuit
16, 16A, 16B switch circuit
17, 18 buffer circuit
19 differential amplifier circuit
20 control circuit
20A voltage detection unit
20B switching signal control unit
20C abnormality detection unit
21, 22 voltage-dividing circuit

The invention claimed is:

1. A voltage detection circuit comprising:
a reference voltage output circuit capable of selectively outputting one of a plurality of reference voltages different in voltage value from each other;
a first voltage-dividing circuit connected between a first input terminal and the reference voltage output circuit, the first voltage-dividing circuit outputting a first output voltage given by dividing a first voltage of the first input terminal at a first given voltage-dividing ratio,
wherein the first input terminal is connected to a measurement target and sends the first voltage to the first voltage-dividing circuit;
a second voltage-dividing circuit connected between a second input terminal and the reference voltage output circuit, the second voltage-dividing circuit outputting a second output voltage given by dividing a second voltage of the second input terminal at a second given voltage-dividing ratio,
wherein the second input terminal is connected to the measurement target and sends the second voltage to the second voltage-dividing circuit;
a first buffer circuit receiving a first input voltage and outputting a first buffered output voltage corresponding to the first input voltage;
a second buffer circuit receiving a second input voltage and outputting a second buffered output voltage corresponding to the second input voltage;
a voltage detection unit that detects the first buffered output voltage from the first buffer circuit and the second buffered output voltage from the second buffer circuit; and
a switch circuit connected to the first buffer circuit and to the second buffer circuit, wherein the switch circuit
switches the first input voltage between at least the first output voltage of the first voltage-dividing circuit and one of the plurality of reference voltages outputted from the reference voltage output circuit, and
switches the second input voltage between at least the second output voltage of the second voltage-dividing circuit and one of the plurality of reference voltages outputted from the reference voltage output circuit.

2. The voltage detection circuit according to claim 1, comprising:
a third voltage-dividing circuit connected between the first input terminal and the reference voltage output circuit in parallel with the first voltage-dividing circuit, the third voltage-dividing circuit outputting a third output voltage given by dividing the first voltage of the first input terminal at a third given voltage-dividing ratio; and
a fourth voltage-dividing circuit connected between the second input terminal and the reference voltage output circuit in parallel with the second voltage-dividing circuit, the fourth voltage-dividing circuit outputting a fourth output voltage given by dividing the second voltage of the second input terminal at a fourth given voltage-dividing ratio, and
wherein a connection state of the switch circuit is switched so that the first output voltage from the first voltage-dividing circuit or the third output voltage from the third voltage-dividing circuit is inputted to the first buffer circuit as the first input voltage while the second output voltage from the second voltage-dividing circuit or the fourth output voltage from the fourth voltage-dividing circuit is inputted to the second buffer circuit as the second input voltage.

3. The voltage detection circuit according to claim 1, wherein
the reference voltage output circuit includes:
a resistance circuit including a plurality of resistors connected in series, the resistance circuit having a given source voltage applied thereto; and
a switch element that switches a connection state of at least one of the plurality of resistors, and
the reference voltage output circuit is configured to be able to select one of the plurality of reference voltages through switching on and off of the switch element.

4. The voltage detection circuit according to claim 1, wherein
the reference voltage output circuit includes:
a plurality of power supply circuits that output different source voltages; and
a switch element that switches connection of the plurality of power supply circuits, and
one of the plurality of reference voltages can be selected through switching of the connection by the switch element.

5. The voltage detection circuit according to claim 1, wherein the switch circuit includes:
a first switch element that switches connection of an input terminal of the first buffer circuit, to the first input terminal or to the reference voltage output circuit; and
a second switch element that switches connection of an input terminal of the second buffer circuit, to the second input terminal or to the reference voltage output circuit.

6. The voltage detection circuit according to claim 1, wherein the switch circuit includes:
a first switch element that switches a connection state between an input terminal of the first buffer circuit and the reference voltage output circuit; and
a second switch element that switches a connection state between an input terminal of the second buffer circuit and the reference voltage output circuit.

7. The voltage detection circuit according to claim 1, further comprising:
an abnormality detection unit that detects an abnormality of the voltage detection circuit,
wherein when the first input voltage of the first buffer circuit and the second input voltage of the second buffer circuit are each switched by the switch circuit to one of the plurality of reference voltages output from the reference voltage output circuit, the abnormality detection unit determines whether the voltage detection circuit has the abnormality, based on at least one of the first buffered output voltage from the first buffer circuit and the second buffered output voltage from the second buffer circuit, the first buffered output voltage and the second buffered output voltage are each detected by the voltage detection unit, and
wherein when the first input voltage of the first buffer circuit is switched by the switch circuit to the first output voltage from the first voltage-dividing circuit and the second input voltage of the second buffer circuit is switched by the switch circuit to the second output voltage from the second voltage-dividing circuit, the abnormality detection unit determines whether the voltage detection circuit has the abnormality, based on at least one of the first buffered output voltage from the first buffer circuit and the second buffered output voltage from the second buffer circuit, the first buffered output voltage and the second buffered output voltage are each detected by the voltage detection unit.

8. The voltage detection circuit according to claim 6, wherein
when the first input voltage of the first buffer circuit and the second input voltage of the second buffer circuit are each switched by the switch circuit to one of the plurality of reference voltages, the abnormality detection unit acquires the first buffered output voltage from the first buffer circuit, the second buffered output voltage from the second buffer circuit, and each of the plurality of reference voltages being detected by the voltage detection unit,
when the first input voltage of the first buffer circuit is switched by the switch circuit to the first output voltage and the second input voltage of the second buffer circuit is switched by the switch circuit to the second output voltage, the abnormality detection unit acquires the first buffered output voltage from the first buffer circuit, the second buffered output voltage from the second buffer circuit, and each of the plurality of reference voltages being detected by the voltage detection unit, and
the abnormality detection unit determines whether the voltage detection circuit has the abnormality, based on the first buffered output voltage acquired from the first buffer circuit and the second buffered output voltage acquired from the second buffer circuit.

9. The voltage detection circuit according to claim 1, further comprising:
a differential amplifier circuit that outputs a third voltage corresponding to a difference between the first buffered output voltage from the first buffer circuit and the second buffered output voltage from the second buffer circuit; and
an abnormality detection unit that detects an abnormality of the voltage detection circuit,
wherein the voltage detection unit detects a fifth output voltage from the differential amplifier circuit, and
wherein when the first input voltage of the first buffer circuit and the second input voltage of the second buffer circuit are each switched by the switch circuit to one of the plurality of reference voltages output from the reference voltage output circuit and a reference voltage output from the reference voltage output circuit is switched, the abnormality detection unit determines whether the voltage detection circuit has the abnormality, based on a linear equation generated from the third voltage output from the differential amplifier circuit, the third voltage being detected by the voltage detection unit.

10. The voltage detection circuit according to claim 1, wherein
the first given voltage-dividing ratio and the second given voltage-dividing ratio are a same ratio, or
the first given voltage-dividing ratio and the second given voltage-dividing ratio are different ratios.

11. The voltage detection circuit according to claim 2, wherein
the first given voltage-dividing ratio, the second given voltage-dividing ratio, the third given voltage-dividing ratio, and the fourth given voltage-dividing ratio are each independently selected and may be an identical ratio, different ratios, or comprise any combination of identical and different ratios.

* * * * *